United States Patent [19]

Sommerkamp et al.

[11] 4,328,763
[45] May 11, 1982

[54] VAPORIZER FOR VACUUM DEPOSITION INSTALLATIONS

[75] Inventors: Peter Sommerkamp, Hanau am Main; Walter Heil, Neuberg, both of Fed. Rep. of Germany

[73] Assignee: Leybold-Heraeus, Cologne, Fed. Rep. of Germany

[21] Appl. No.: 145,632

[22] Filed: May 1, 1980

[30] Foreign Application Priority Data

May 3, 1979 [DE] Fed. Rep. of Germany ....... 2917841

[51] Int. Cl.³ .............................................. C23C 13/12
[52] U.S. Cl. .................................... 118/727; 118/715; 219/271; 427/255.7
[58] Field of Search ............... 118/723, 724, 725, 726, 118/727, 50.1, 715, 722; 13/31 R, 31 EB; 219/271, 275; 927/282, 255.7, 248.1, 255.6

[56] References Cited

U.S. PATENT DOCUMENTS

| 3,227,133 | 1/1966 | Anderson et al. ............... 118/727 X |
| 3,575,133 | 4/1971 | Van Audenbove et al. ....... 118/727 |
| 3,853,091 | 12/1974 | Christensen et al. ........... 118/725 X |
| 3,856,557 | 12/1974 | Cuttell et al. .................... 118/719 X |
| 4,217,856 | 8/1980 | Kraus ................................. 118/726 |

FOREIGN PATENT DOCUMENTS 2507953 9/1975 Fed. Rep. of Germany ... 427/255.7
1361771 7/1974 United Kingdom .

*Primary Examiner*—John D. Smith
*Assistant Examiner*—Bernard E. Plantz
*Attorney, Agent, or Firm*—Felfe & Lynch

[57] ABSTRACT

A vaporizer for vacuum deposition installations has at least one crucible and a plurality of crucible-receiving recesses movable into a vaporizing position, a vapor-conducting device and a shutter for interrupting the flow of vapor. The vaporizer is capable of enabling a plurality of different substances to be vaporized in succession without mutual contamination by providing the vapor-conducting device wherein the device has a plurality of vapor screens which can be individually set down at the edges of the crucible-receiving recesses by relative movement between the vapor-conducting device and the crucible. The shutters have a plurality of lobes which can be individually moved over the particular vapor screen located in the vaporizing position. The drives associated with the vapor-conducting device and shutter are interconnected such that the same vapor screen and the same shutter lobe are always associated with a particular crucible-receiving recess.

9 Claims, 3 Drawing Figures

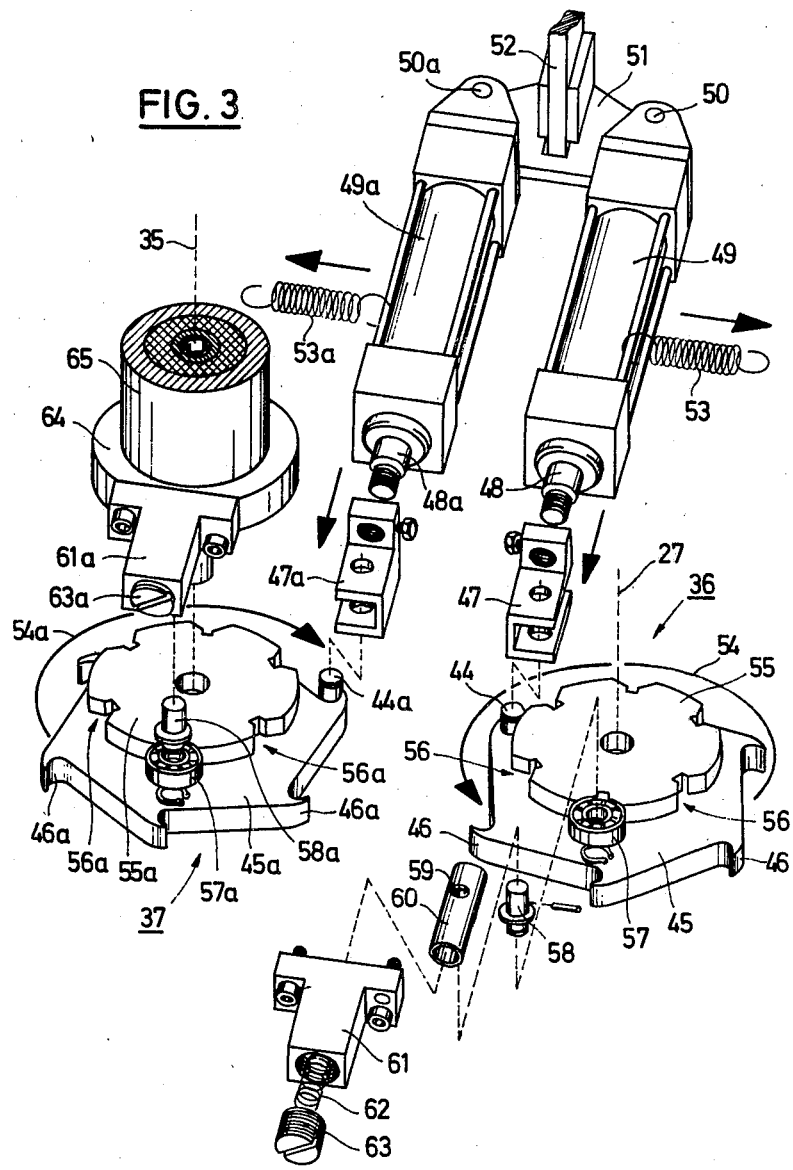

VAPORIZER FOR VACUUM DEPOSITION INSTALLATIONS

BACKGROUND OF THE INVENTION

The present invention relates to a vaporizer for vacuum deposition installations, particularly electron-beam vaporizing means, having at least one crucible and a plurality of crucible-receiving recesses movable into a vaporizing position, and having a vapor-conducting device and a shutter for interrupting the flow of vapor.

The "vapor rays" emanating from vaporizers are relatively diffuse and are propagated in such a form that it is impossible to avoid applying a vapor deposit to surfaces other than those of the substrate intended to be coated. It is known to concentrate or deflect vapor rays by means of vapor-deflecting devices, reflectors, etc., which are firmly connected to the vaporizer concerned. In such arrangements no problem arises if the vapor condenses on the conducting device. Also, vapor condensate can be prevented from forming by keeping the vapor-conducting device at a suitable temperature level.

Difficulties arise, however, when use is made of what are known as multi-dish crucibles from which are vaporized different substances which should not contaminate each other. This need arises, for example, in the vapor-deposition of what are called interference-layer systems consisting of individual layers having different refractive indices and as used in optical products, or during the vapor deposition of alternately conductive and insulating coatings in the cae of electronic products.

In the case of a vaporizer comprising a multi-dish crucible but no conducting device, it is known, for the purpose of preventing mutual contamination of the individual deposition substances, to provide a screen plate above the crucible, which screen plate is provided with an opening at that point where one of the crucible-receiving recesses is located at the vaporizing position, whereas the projection of the vaporizing plate covers the remaining recesses. Apart from there being no vapor-conducting devices in this system, mutual contamination of the vaporization substances cannot be avoided, since because of the displaceability of the multidish crucible, a gap, albeit narrow, is present between the crucible and the screen plate, and material can pass through this gap to the adjacent substance and can form a vapor deposit thereon. Furthermore, part of the vapor condenses on the screen plate and can pass into the adjacent substance. A further risk of mutual contamination arises as a result of part of the vapor inevitably condensing on the shutter which can be swung into the vapor stream. After the coating on the shutter has acquired a relatively large thickness, it begins to flake off, and the possibility of particles of one or more substances falling into the crucible dish containing another substance cannot be precluded.

SUMMARY OF THE INVENTION

The object of the present invention is to provide a vaporizer of the initially described kind whereby a plurality of different substances can be deposited in turn by vaporization without contaminating each other.

According to the invention and in the case of a vaporizer of the initially described kind, this object is achieved in that a vapor-conducting device is provided above the crucible, which device has a plurality of vapor screens which can be individually set down at the edges of the crucible-receiving recesses by relative movement between the vapor-conducting device and the crucible, in that the shutter has a plurality of lobes, which can be individually moved over the particular vapor screen located in the vaporizing position, and in that drives are associated with the vapor-conducting device and the shutter, by means of which drives the same vapor screen and the same shutter lobe are always associated with a particular crucible-receiving recess.

The advantage inherent in the solution provided by the invention is that in each case only those same parts (crucible-receiving recesses, vapor screens and shutter lobes) are associated with each other that might have condensate of the same vaporization substance on them. As a result of the mounting of the vapor-conducting device on the edge of the crucible-receiving recess, any lateral gap through which vapor particles could diffuse is sealed off in a reliable manner. Neither cross-vaporization nor back-diffusion from vapor-deposited coatings onto other materials is possible. The vaporizer crucible, vapor screen and shutter lobe form a substantially closed chamber. It thus becomes possible to deposit two or more different substances on the substrate surfaces without the qualities of the coatings being adversely affected on a reciprocal basis.

During the indexing of the crucible, vapor-conducting device and shutter, it is generally advisable to allow a short period to elapse until the contents of the crucible-receiving recess have cooled to such an extent that a vapor stream is no longer formed. However, in a further advantageous embodiment of the subject-matter of the invention, a screen plate is arranged above the crucible, which screen plate is provided with an opening at the point where the crucible-receiving recesses are located in the vaporizing position, whereas the projection of the screen plate covers the remaining crucible-receiving recesses, and the vapor screens can be individually moved through the opening in the screen plate and set down at the edges of the crucible-receiving recesses. This arrangement enables the crucible, vapor-conducting device and shutter to be indexed more rapidly, since it is then not necessary to wait until the substance that has just been deposited has cooled down.

Further advantageous forms of the subject-matter of the invention are disclosed hereinafter. For example, the vapor screens and the shutter lobes are axially symmetrically secured to shafts in the manner of lathe turrets and the vapor screens may be designed as hollow bodies of revolution. Moreover, the crucible may be movable from below towards the vapor-conducting device.

In another advantageous embodiment, the drives for the vapor-conducting device and the shutter, respectively, are designed as ratchet drives each comprising a pawl and a ratchet wheel. The ratchet wheel advantageously has a number of teeth which is a whole-number multiple of the number of crucible-receiving recesses. The pawl is preferably arranged on a piston rod of a pressure cylinder which can be swung in a plane parallel to the plane of the ratchet wheel and the ratchet wheel is connected to an index wheel which has recesses, the number of which corresponds to the number of teeth and in which an index roller can latch.

A form of construction of the subject-matter of the invention and details thereof will now be described in greater detail by reference to the drawings.

BRIEF DESCRIPTION OF THE DRAWINGS

FIG. 3 is a perspective exploded view of the important drive parts for the vapor-conducting device and for the shutter.

DETAILED DESCRIPTION OF THE INVENTION

Figure 1:
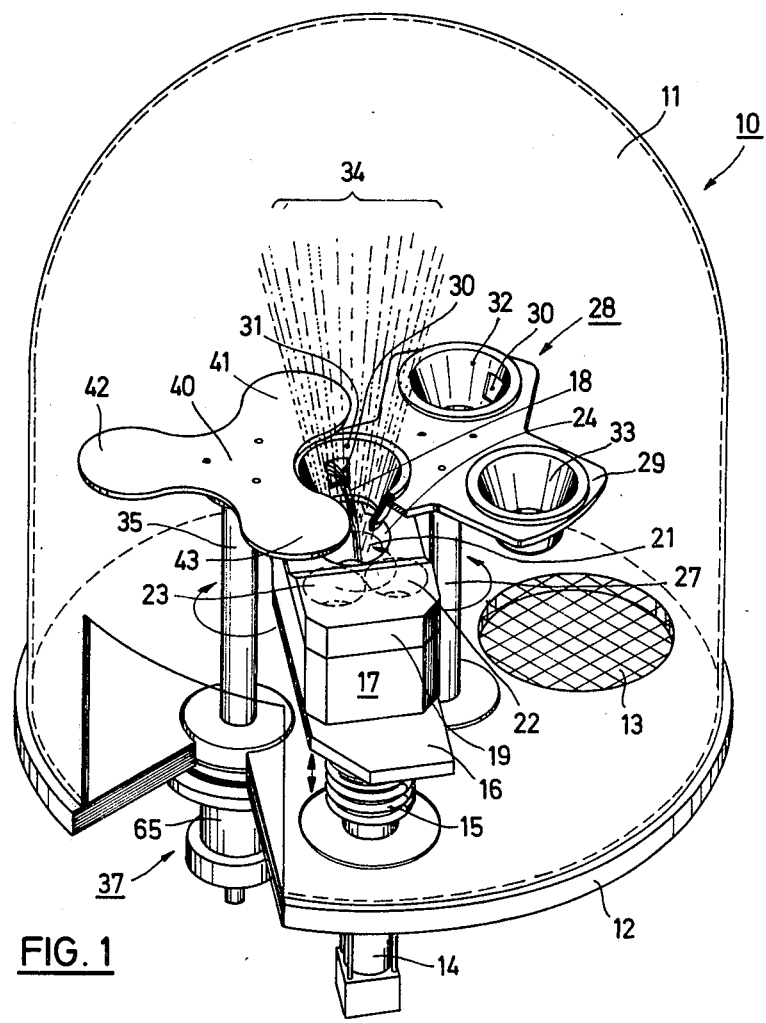
FIG. 1 is a perspective illustration of a complete vacuum deposition installation comprising a vaporizer in accordance with the invention.

FIG. 1 illustrates a vacuum chamber 10 which consists of a removable bell 11 and base-plate 12 and which can be evacuated by way of a suction orifice 13 with the aid of a pump unit, not illustrated. Below the base-plate 12 is a compressed-fluid drive 14 having a piston-rod, not illustrated, which moves within a bellows 15 and is connected to a horizontal platform 16 so that the latter can be vertically displaced when the drive 14 is activated.

Figure 2:
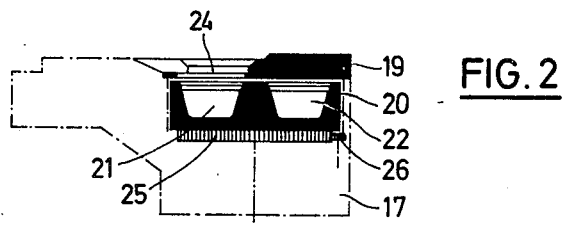
FIG. 2 is a cross-section through the vaporizer crucible and the screen plate arranged above it.

Arranged on the platform 16 is an electron-beam vaporizer 17, the main parts of which are known in the prior art and do not therefore need to be described. Details of such a vaporizer are provided in DE-PS 22 06 995. When operating such an electron-beam vaporizer, an electron beam 18 is produced which is diverted towards a rotatable crucible 20 (FIG. 2) which is arranged below a screen plate 19 and, in the present case, is provided with three crucible-receiving recesses 21, 22 and 23 arranged in a circle. The screen plate 19 is provided with an opening 24 at a point where the crucible-receiving recess 21 is in the vaporizing position. The cross-section of the opening 24 is slightly greater than the upper cross-section of the crucible-receiving recesses. The arrangement is such that each of the crucible-receiving recesses can be brought into register with the opening 24. The remaining crucible-receiving recesses 22 and 23 are covered by the screen plate 19, while the recess 21 is in its vaporizing position. As shown in particular in FIG. 2, the crucible 20 is provided with a toothed wheel 25 which is engaged by a pinion 26, which is connected to a drive shaft, not illustrated. The control or drive of the pinion 26 is also achieved by means of a bellows 15.

Arranged alongside the platform 16 is a vertical shaft 27, at the upper end of which is arranged a vapor-conducting device 28. This consists of a horizontal plate 29 with three vapor screens 31, 32 and 33 arranged in a circle, the center point of the circle being determined by the shaft 27. The vapor screens are designed as hollow bodies of rotation, in particular hollow cones, the smaller opening of which is directed downwardly. The lower ends of the vapor screens are adapted to suit the crucible-receiving recesses 21, 22 and 23 and the opening 24 in such a way that the vapor screens can be individually passed through the opening 24 and set down on the edges of the crucible-receiving recesses. In the present case, this is achieved in that, at a specific angular position of the vapor-conducting device 28, the platform 16 and therefore the electron-beam vaporizer 17 are raised by means of the compressed-fluid drive 14 and are pressed from below against the vapor-screen 31 concerned. Formed in each of the vapor screens is a window 30 through which the electron beam 18 can be projected into the particular crucible-receiving recess. Contained in each crucible-receiving recess is the substance to be vapor-deposited. The vapor stream 34 formed when this substance is bombarded by the electron beam 18 is indicated by diverging dash-dot lines. The vapor stream strikes substrates, not illustrated, which are secured on a substrate holder, likewise not illustrated, which is located above the electron-beam vaporizer 17. At that side of the platform 16 remote from the shaft 27 is arranged a further vertical shaft 35, at the upper end of which is mounted a shutter 40. This consists of a horizontal plate with three lobes 41, 42 and 43 which together form a cloverleaf construction so that, in the illustrated position, they do not cover the upper opening of the vapor screen 31 located in the vaporizing position, but are able to close off this opening almost completely, after the shaft 35 is turned through 60 degrees.

The plate 29 and the shutter lobes 41, 42 and 43 are disposed in two parallel planes, the shutter lobes being arranged so close to the tops of the vapor screens 31, 32 and 33 that unrestricted movement of the parts relatively to each other is just possible.

Associated with the shaft 27 and the shaft 35 are drives 36 and 37 which are illustrated in detail in FIG. 3. FIG. 1 illustrates only the encased drive 37 for the shaft 35. By means of these drives, the shafts 27 and 35 can be caused to rotate in such a way that the vapor-conducting device 28 can be rotated in a stepwise manner through an angle of 120 degrees, whereas the shaft 35 can be rotated in steps of 60 degrees, depending upon whether the vapor stream 34 is to be released or blocked. In each case, the synchronization of the drives 36 and 37 as well as their control elements, not illustrated, ensures that only the same combination of crucible-receiving recess, vapor screen and shutter lobe cooperate, i.e., 21/31/41, 22/32/42 and 23/33/43, respectively. Thus, on each occasion, only those parts, whose surfaces are coated with the same vapor-deposited substance, come together, so that any spalling of surface coatings and their collapse into the crucible-receiving recess concerned cannot lead to contamination of the vaporizing substance. Because of the system described, neither the vapor screens nor the shutter lobes need to be heated to prevent condensation. This avoidance of heating is of particular importance, since to prevent condensation of the majority of materials, very high surface temperatures would be necessary, and in most cases this would be accompanied by undesirable thermal loading of the substrates and of the entire installation.

As shown in FIG. 3, a drive 36 is secured to the righthand shaft 27, represented only by a broken line. The drive is of the pawl and ratchet type, and incorporates a pawl 44 and a ratchet wheel 45. The ratchet wheel has an even number of teeth 46, which form a whole-number multiple of the number of crucible-receiving recesses. If three such recesses are present, six evenly spaced teeth are expediently provided on the periphery of the ratchet wheel, so that the ratchet wheel 46 for the vapor-conducting device 28 can be turned, for example, through 120 degrees in two steps.

For this purpose, the pawl 44 is fitted in a holder 47 which is arranged at the end of a piston-rod 48 of a compressed-fluid cylinder 49. At its far end, the cylinder 49 is secured by means of a vertical pin 50 to a bearing plate 51, which in turn, is secured by way of an upright 52 to the baseplate 12 (FIG. 1). The cylinder 49 can thus be swung about the pin 50 in a plane extending parallel with the plane of the ratchet wheel 45. The swinging movement takes place in the direction opposite to that of the action of a spring 53, whereby the pawl 44 is radially urged towards the ratchet wheel 45. Simple reciprocatory movement of the piston-rod 48 causes the ratchet wheel 45, and with it, the shaft 47, to be turned in a stepwise manner in the direction indicated by the arrow 54. The length of a step, which is 60 degrees in the rotary direction, enables a drive of optimum design to be used.

To enable the ratchet wheel 45 to be definitely halted at the end of each individual step, and to prevent the ratchet wheel from being driven in the rearward direction by the pawl 44, the ratchet wheel 45 is solidly connected to an index wheel 55 which is provided with recesses 56, the number of which corresponds to that of the teeth 46. Engageable in the recesses 56 is an index roller 57 which is mounted on a pivot pin 58, fitted in a bore 59 formed in a slide 60. The slide 60 is longitudinally displaceable in a casing 61, which is non-displaceably mounted on the base-plate 12. The slide 60 is pushed in the radial direction towards the index wheel 55 by means of the spring 62, so that positive engagement is achieved. The spring 62 can be acted on and adjusted by means of a set-screw 63. Basically the same elements are used for the drive 37 for the shaft 35 arranged on the left, but these elements are disposed in a mirror-image arrangement. For this reason, the same reference numerals, but with "a" suffixes, are used, i.e., the numerals 44a to 63a. It will be seen that the casing 61a is screwed onto a housing 64 which, in turn, is connected to the base-plate 12 by way of a short tubular element 65.

The invention is not limited to electron-beam vaporizers, but can be used for all types of varporizers irrespective of their heating, for example for resistance vaporizers arc vaporizers, induction vaporizers and laser-beam vaporizers. The crucible-receiving recesses do not necessarily have to be provided in a common crucible, but can be distributed over two or more crucibles. It is thus possible to arrange a plurality of crucibles in a rotatable clamping means. Alternatively, a plurality of individual crucibles each having one or more recesses can be arranged in a row, and the recesses can be moved in turn into their vaporizing position. The expression "crucible-receiving recesses" will be understood as meaning all depressions in the vaporizers concerned that are provided for receiving the vaporizing material in solid or fluid form. Consequently, the designation "crucible" is applied to such resistance vaporizers that consist of a suitably shaped strip of sheet metal and are clamped between current-carrying contacts, water-cooling not being provided.

What is claimed is:

1. In a vaporizer for vacuum deposition installations having at least one crucible and a plurality of crucible-receiving recesses, means for successively moving each recess into the same vaporizing position, vapor-conducting means for conducting vapors from the recess and shutter means for interrupting the flow of vapor from the vapor-conducting means, the improvement comprising means covering the crucible-receiving recesses not in the vaporizing position and wherein the vapor conducting means comprises a plurality of vapor screens and means for moving the screens to effect successive alignment of one screen with one recess and to effect relative vertical movement between the aligned recess and screen to provide a vapor-tight engagement, wherein the shutter means comprises a plurality of lobes and means for moving the lobes to successively align one over the aligned vapor screen and recess and means for effecting the successive alignment of the same lobe and vapor screen for a single same recess to prevent cross contamination.

2. The vaporizer according to claim 1, wherein the vapor screens and the shutter lobes are axially symmetrical and the means for moving same comprise rotatable turrets having driving shafts.

3. The vaporizer according to claim 1 or claim 2, wherein the vapor screens comprise hollow bodies of revolution.

4. The vaporizer according to claim 1, wherein the means effecting relative movement moves the crucible from below towards the vapor-conducting means.

5. The vaporizer according to claim 1, wherein the means for moving the screens and the lobes each comprise ratchet drives each comprising a pawl and a ratchet wheel.

6. The vaporizer according to claim 5, wherein the ratchet wheel has a number of teeth, which is a whole-number multiple of the number of crucible-receiving recesses.

7. The vaporizer according to claims 5 or claim 6, wherein the ratchet drive further comprises a piston rod of a pressure cylinder mounted for movement in a plane parallel to the plane of the ratchet wheel and on which pawl is mounted.

8. The vaporizer according to claim 5 wherein the ratchet drive further comprises an index wheel connected to the ratchet wheel and having recesses, the number of which corresponds to the number of teeth, an index roller for latching in the index wheel recesses.

9. The vaporizer according to claim 1, wherein the covering means comprises a screen plate disposed above the crucible and having an opening at the point where each crucible-receiving recess is located in the vaporizing position with the remainder of the screen plate covering the remaining crucible-receiving recesses and wherein the means relatively vertically moving the vapor screens moves same one at a time through the opening in the screen plate to set same down at the edges of the crucible-receiving recesses.

* * * * *